United States Patent
Belau

(10) Patent No.: US 7,208,716 B2
(45) Date of Patent: Apr. 24, 2007

(54) IMAGE-GENERATION DEVICE, IN PARTICULAR FOR INSTALLATION IN THE ROOF AREA OR EXTERIOR REARVIEW MIRROR OF A MOTOR VEHICLE

(75) Inventor: Horst Belau, Langquaid (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/538,406

(22) PCT Filed: Nov. 21, 2003

(86) PCT No.: PCT/EP03/13096

§ 371 (c)(1),
(2), (4) Date: Jun. 10, 2005

(87) PCT Pub. No.: WO2004/057857

PCT Pub. Date: Jul. 8, 2004

(65) Prior Publication Data

US 2006/0038108 A1    Feb. 23, 2006

(30) Foreign Application Priority Data

Dec. 19, 2002 (DE) .............................. 102 59 795

(51) Int. Cl.
*H01L 31/0203* (2006.01)
*H01L 23/34* (2006.01)

(52) U.S. Cl. .............................. 250/214 R; 250/214.1; 250/208.1; 257/724

(58) Field of Classification Search ................ 250/239, 250/208.1, 214 R, 214.1, 227.25; 257/433, 257/434, 686, 723, 724, 777, 787, 788; 174/52.1, 174/52.4; 29/829, 831; 361/748, 749, 774, 361/760–764; 348/294, 374

See application file for complete search history.

(56) References Cited

U.S. PATENT DOCUMENTS 4,831,456 A    5/1989    Takamura (Continued)

FOREIGN PATENT DOCUMENTS

DE    37 36 688 C2    6/1988

(Continued)

*Primary Examiner*—Stephone B. Allen
(74) *Attorney, Agent, or Firm*—Laurence A. Greenberg; Werner H. Stemer; Ralph E. Locher

(57) ABSTRACT

The invention relates to an image generation device (1), particularly a 3D camera. The inventive image generation device (1) is designed in order to obtain small dimensions and to take thermal considerations into account. The camera (1) has at least one, in particular, rigid first printed board (10) for highly complex semiconductors such as a microcontroller (11), memory (12), etc. with at least one optical image recording sensor (50), and has a second printed board (20) for all other components such as, in particular, large capacitors, transistors, resistors, coils (21) or plugs (22), etc. The first (10) and second (20) printed boards are mounted on, preferably glued to, a metallic base plate (40). The inventive image generation device (1) advantageously comprises, at least in the area of its optics modules (50, 51, 52, 53), a minimum overall height thus making it particularly well-suited for use as a built-in component serving as an occupant recognition unit in the roofliner, as a lane-change assistant in the exterior rearview mirror or for similar applications or installation locations in a motor vehicle even in locations where extreme installation conditions exist and prior art camera systems fail.

22 Claims, 2 Drawing Sheets

U.S. PATENT DOCUMENTS

| | | | |
|---|---|---|---|
| 4,868,646 | A | 9/1989 | Tsuji |
| 6,350,953 | B1 | 2/2002 | Franzen |
| 6,414,388 | B1 * | 7/2002 | Moriyama ............... 257/724 |
| 6,798,031 | B2 * | 9/2004 | Honda et al. ............. 257/433 |
| 6,820,798 | B1 | 11/2004 | Heinz et al. |
| 2001/0055073 | A1 | 12/2001 | Shinomiya |
| 2002/0007110 | A1 | 1/2002 | Irion |
| 2002/0044215 | A1 | 4/2002 | Takagi et al. |
| 2004/0232312 | A1 | 11/2004 | Belau |
| 2006/0043514 | A1 * | 3/2006 | Shizuno ................... 257/434 |

FOREIGN PATENT DOCUMENTS

| | | |
|---|---|---|
| DE | 38 10 295 C2 | 3/1992 |
| DE | 42 41 938 A1 | 6/1994 |
| DE | 195 42 835 A1 | 5/1997 |
| DE | 196 39 921 A1 | 10/1997 |
| DE | 197 01 854 C1 | 5/1998 |
| DE | 198 16 054 A1 | 10/1998 |
| DE | 199 23 701 A1 | 11/2000 |
| DE | 199 29 754 A1 | 1/2001 |
| DE | 199 32 904 C1 | 4/2001 |
| DE | 199 09 505 C2 | 11/2001 |
| DE | 202 06 741 U1 | 9/2002 |
| EP | 0 541 449 A2 | 11/1992 |
| EP | 0 741 504 A2 | 11/1996 |
| EP | 0 885 782 A1 | 12/1998 |
| EP | 0 983 712 B1 | 9/2001 |
| JP | 2002077678 | 3/2002 |
| WO | 03/005455 A1 | 1/2003 |

* cited by examiner

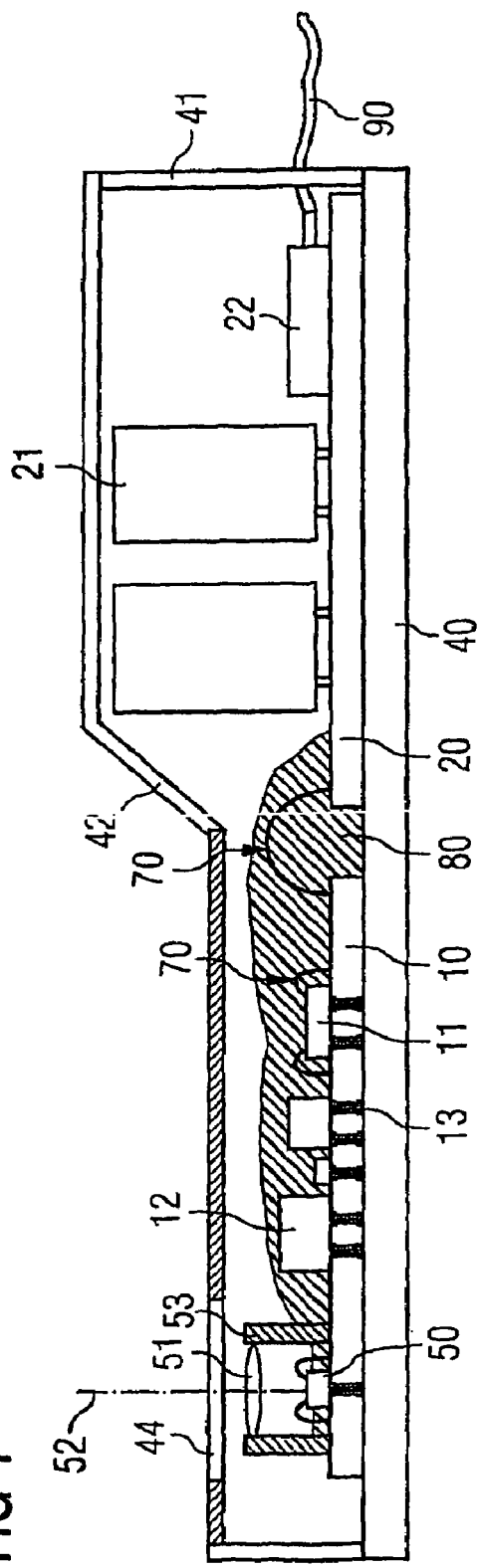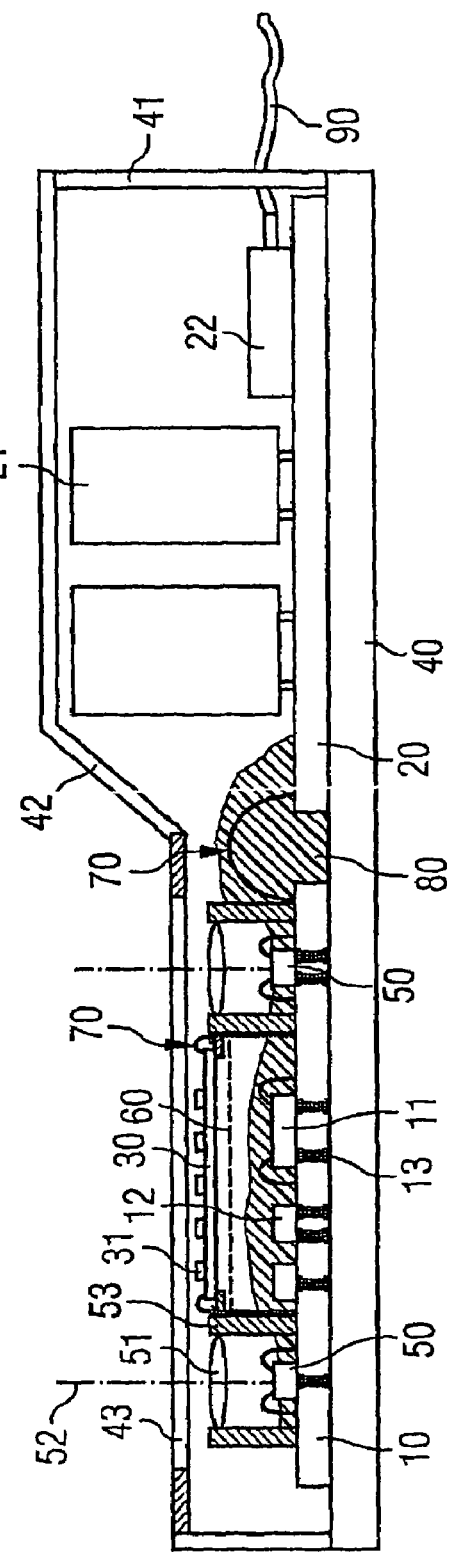

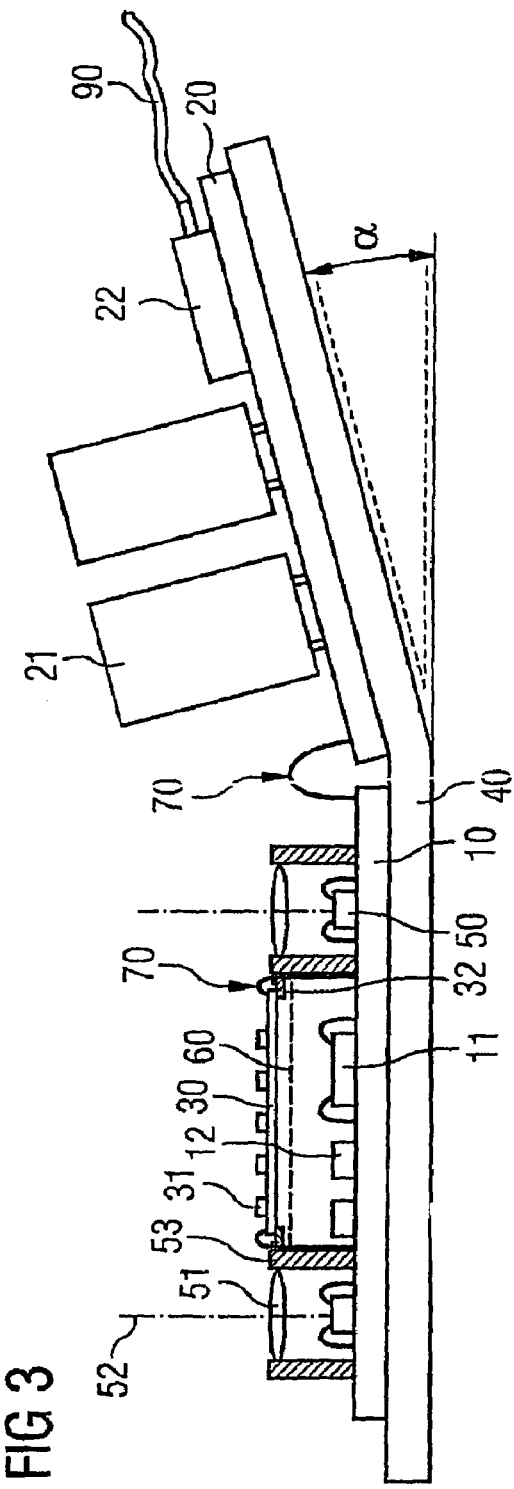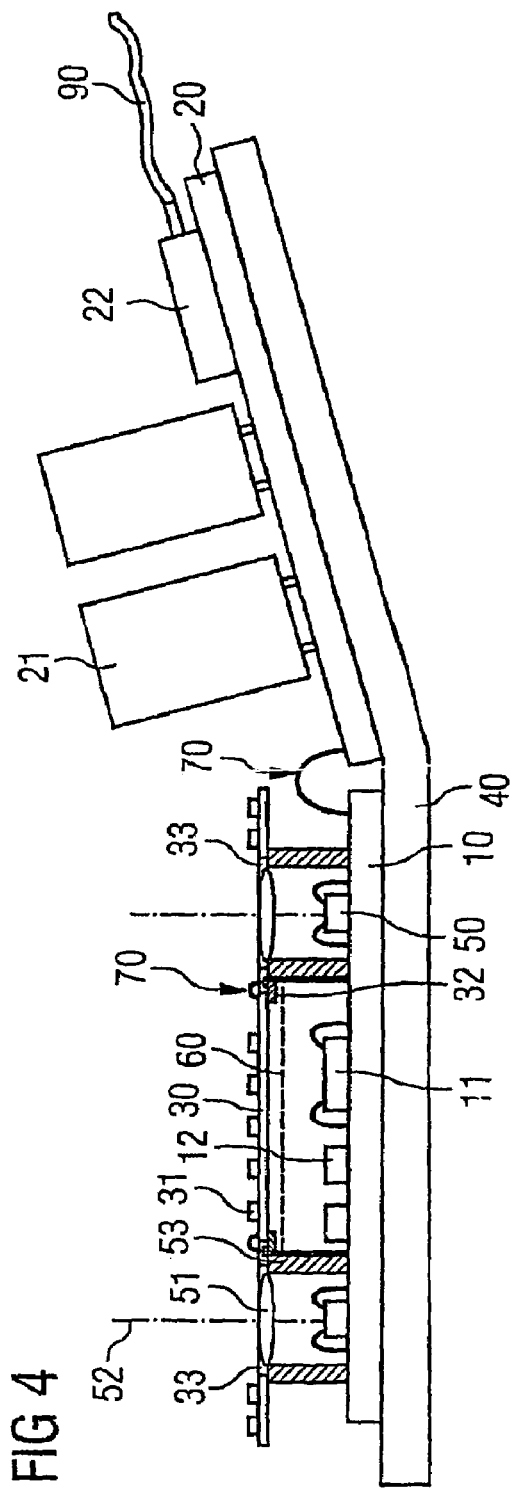

IMAGE-GENERATION DEVICE, IN PARTICULAR FOR INSTALLATION IN THE ROOF AREA OR EXTERIOR REARVIEW MIRROR OF A MOTOR VEHICLE

BACKGROUND OF THE INVENTION

Field of the Invention

The invention relates to an image-generation device, in particular for installation in the roof area of a motor vehicle for the purpose of detecting an object, such as a person, or a characteristic element, such as the side area of a vehicle seat, in the interior of the vehicle; for installation in the exterior rearview mirror of a motor vehicle for the purpose of detecting an object or, as the case may be, another vehicle on the adjacent roadway lane; or for further suchlike applications.

The roof area in the car is preferably provided as the mounting location for image-generation devices such as mono or 3D cameras for detecting an object or element in the interior of a vehicle. Cameras of said type for detecting an object for the purpose, for example, of assisting during lane changing are preferably installed in the exterior rearview mirror of a motor vehicle.

What is in both cases problematic is, firstly, providing assurance of securing, on the one hand, optics means and an image-recording sensor rigidly in terms of position and direction and, on the other hand, in the case of a 3D camera, two such optics modules in such a manner with respect to each other. The optics means must in particular neither move nor vibrate with respect to each other: A not insignificant constraint given the multiplicity of vibrations to which a motor vehicle is habitually subjected.

It is known, for instance, how to rigidly connect the optics module to the housing of the image-generation device in order to ensure appropriate securing or, as the case may be, alignment. The optics module is usually previously linked in circuit engineering terms by means of a flexible printed board employing flip-chip technology, with the optics means subsequently rigidly connected to the housing being positioned in front of the open window with an image-recording sensor located behind it. The what are termed flex foils not only avoid plug-in connector elements; owing to their flexible design they also advantageously allow a plurality of rigidly secured optics modules to be linked to a single printed board. However, highly complex semiconductor components having numerous connections and defined conductor impedances cannot be implemented by this means: Said components have to be accommodated on an additional printed board. The assembly of a thus embodied image-generation device is rather to be classified as intricate. Moreover, heat dissipation is problematic in the case of flex foils on account of the high thermal resistance of approximately 120 K/W. This is due, on the one hand, to the opening for the active optical area (window in the printed board) and, on the other hand, to a lack of copper surfaces (no multi-layering in the structure of the board). Moreover, no cooling elements can be provided since they would detract from the advantages of flex foils.

Assured heat dissipation has a crucial impact, however, on the image-generation device's image quality. Said quality is the poorer the higher the temperature is, or, as the case may be, is the better the colder the optics modules remain. Apart from the image-recording sensor itself, the microprocessor and further highly complex electronic components remain heat sources of the image-generation device. More stringent temperature requirements due to the impact of sunlight producing an ambient temperature of up to approximately 105° C. for the optics modules are a further aggravating factor. Installation in the roof area or, as the case may be, exterior rearview mirror is virtually precluded in the case of, in particular, a 3D camera for thermal reasons. It is furthermore also extremely difficult in terms of manufacturing engineering to dissipate the relevant quantities of heat using conventional printed circuit board technology. The problem of heat dissipation remains unresolved.

The problems are finally further compounded by the limited installation space available in the roof liner as well as in the exterior rearview mirror if all the image-generation device's electronic components are to be located in one housing for, say, cost and production reasons. The dimensions are too large for the installation space currently available in the vehicle. Different precisely defined geometric embodiments of the components or modes of distributing them ranging as far as solutions having a central device in the interior of the motor vehicle and an optics module comprising, for instance, a CMOS (CMOS: Complementary Metal Oxide Semiconductor) image-recording sensor in the roof liner or, as the case may be, exterior rearview mirror are not only expensive but also intricate. In particular the line length cannot be unrestricted because driver power is routinely restricted. Thus with these satellite solutions, alongside the known what are termed SMD (SMD: Surface Mount Device) components or, as the case may be, chip carriers such as capacitors, transistors, resistors, coils, etc., it is necessary to provide, in particular, plug-in elements. Add to this the fact that with the known SMD technology the components or, as the case may be, chip carriers are mounted flush onto the printed-circuit board and the electric terminals of the chip carriers are connected to the conductors by means of leads directly on the surface. Metal-plated areas or leads attached flush to the printed-circuit board serve as electric terminals of the components. The components are secured into position by means either of adhesives (followed by the application of a flow-soldering method) or of solder pastes in the case of what is termed reflow soldering. This technology is inherently prone to the risk of incorrect terminal assignment at the expense of connection reliability.

SUMMARY OF THE INVENTION

The object of the present invention is therefore to provide an improved image-generation device, one very largely avoiding the above-cited problems, for installation in the roof area of a motor vehicle for the purpose of detecting an object or, as the case may be, element in the interior of a vehicle or for installation in the exterior rearview mirror of a motor vehicle for the purpose of detecting an object or, as the case may be, another vehicle on the adjacent roadway lane. It is at the same time aimed to improve, in particular, several of the partially conflicting framework parameters such as rigidity within and/or between the optics modules, good thermal linking to the passenger compartment, minimal overall height at least in the area of the optics modules, ease of installation and/or suchlike.

Said object is achieved according to the invention by means of an image-generation device having the features of claim 1. Advantageous embodiments and developments that can be employed singly or in combination with each other are the subject of the dependent claims.

This is achieved for an image-generation device of the type cited at the beginning by means of a first printed board for highly complex semiconductors, such as microcontrollers, memories, etc., having at least one optical image-recording sensor, and by means of a second printed board for all other components such as, in particular, large capacitors, transistors, resistors, coils, and plug-in connectors etc. Providing all the electronic components on two printed boards advantageously allows said components to be grouped according to, for example, housing volume or scale of integration and hence makes it possible to produce printed boards having advantageously smaller dimensions. Said boards moreover have exactly reproducible high-frequency properties within a circuit, that being in the case particularly of LVDS (LVDS: Low Voltage Differential Signaling) of advantage to high-speed lines such as, for example, between the microcontroller and a memory module, for example an SIRAM, on account of precisely defined geometric embodying of the individual elements. Locating the first and/or second printed board on a metallic base plate advantageously substantially improves heat removal. The same applies if the printed boards are cemented to the base plate. Screw connections will, moreover, advantageously no longer be required in that case. The base plate will furthermore additionally ensure sufficiently good rigidity and evenness of the printed board modules. The last-cited factor in particular is a prerequisite for correct, in the case of a 3D camera parallel alignment or, as the case may be, orientation of the optical axis (axes). With the housing no longer contributing to rigidity, there will be no need to use flexible printed boards so that there is a further advantage, finally, in the resulting enhanced ease of mounting within a common housing as well as of fitting within limited installation spaces.

To improve thermal linking particularly of the heat-conducting, mostly highly complex components to, for example, a passenger-compartment section, at least the first printed board, but preferably the second printed board also, has thermal pads or vias. Good heat conduction of said type in the carrier material will advantageously result in a more even temperature distribution within the circuitry. To ensure a should-be temperature range in particular for the optical components, it is proposed using preferably what are termed Peltier elements. Being suitable also for increasing the temperature, Peltier elements are far superior to conventional cooling arts. They in particular advantageously make high cooling performance possible within a very small space as well as maximum temperature accuracy.

An optics means is preferably located rigidly and centered above the optical image-recording sensor. Said optics means can, according to a development of the invention, be pre-assembled together with its own housing or a retention means. This will advantageously reduce the number of special housing versions, as encountered in the prior art, for the optics means.

According to the invention at least the first printed board has preferably been manufactured or, as the case may be, equipped using what is termed chip-on-board and/or flip-chip technology. With chip-on-board (COB) technology the semiconductor components are mounted, contacted, and sealed on the printed-circuit board. Alongside its space-saving structural design and weight reduction, the main advantages of this integration method include a high degree of flexibility.

With flip-chip technology, non-housed ICs (dies) are mounted headfirst on the substrate and simultaneously electrically contacted via gold, solder, or adhesive bumps. High packing densities can be achieved in this way. Low-cost flip-chip-on-board technology, which can be combined with surface mount technology (SMT), is especially interesting. For example, it offers substantial potential cost savings owing to its close relationship with standard SMT technology. Even "bumped" flip-chips are, moreover, cheaper to procure than appropriately housed integrated circuits (ICs).

According to the invention the first printed board preferably has a plurality of layers for connections and defined impedances. An optimal packing density and processing speed are advantageously produced by the planar distribution of the terminals. The multi-layer design furthermore advantageously allows the further routing of semiconductor circuits on a small space.

According to the invention the first and second printed board are preferably arranged mutually inclined through preferably the base plate's having an appropriate angle of inclination a. The camera's housing can, owing to said inclination, be advantageously accommodated by simple means also to curved surfaces. The inclination a can be of any angle.

The image-generation device according to the invention preferably also features a third printed board that is preferably located between and/or to the side of the optics means and which supports an illuminating unit, for example LED elements arranged in the form of a matrix. The light-emitting diodes serve, for example, to irradiate a seat in the vehicle. Rays reflected from said seat or, as the case may be, from a characteristic element thereof or an object situated thereon are recorded by the optical image-recording sensor. This makes it possible, for example, to detect the position of a vehicle occupant on the seat or to scan a hazard zone in front of a folded airbag.

According to the invention the third printed board is preferably retained by the optics housing and/or by a separate retention means, with said optics housing and/or retention means establishing, preferably by means of metal plating at least on its surface, an electric connection between the illuminating unit and, for instance, the first printed board.

For the purpose of thermally insulating the first printed board from the LED illuminating module it is proposed locating a suitable insulating medium, in particular a thermal shield, for example a thermal-radiation deflecting foil, between the first and third printed board.

In order to save costs, it is proposed embodying the second and/or third printed board employing an economically more favorable printed-board technology than that used for the first printed board, for which embodying what are termed FR4 technologies, for instance, offer themselves as a solution. The third printed board, but also the second printed board, can in particular be what is termed a metal circuit board, made, therefore of, for example, aluminum or copper, or containing said materials, that advantageously suitably helps to dissipate the heat produced by the LED optics.

According to the invention, the process of connecting the chip terminals to the printed-circuit board and of interconnecting the first and/or second and/or third printed board takes place preferably in an additional work step, for example after an adhesive has hardened, using what is termed a wire bonder known from IC fabrication. Employing wire-bond technology, which is to say applying what are termed bond wires, on the one hand makes it possible to dispense with space-intensive SMD plug-in connections; on the other hand it offers the further advantage of greater connection reliability. This will thus rule out incorrect terminal assignments, via holes for connector pins, wave soldering (where not involving an SMD connector embodiment) or, as the case may be, render such unnecessary. The reliability of the image-generation device will furthermore be increased as a result of reducing the connecting points within the circuitry.

To provide protection from external influences it is proposed encasing the components and/or their bond-wire terminals in an electrically non-conducting sealing compound, for example a plastic compound (glop top).

All the equipping and assembly operations associated with the image-generation device according to the invention can preferably be performed in a hybrid-production process under clean-room conditions. An intermediate step for mounting the optical image-recording sensors onto flex foil can hence advantageously be omitted.

The image-generation device according to the invention is suitable, particularly as an integral component, for a motor vehicle's lane-change assistants located in the exterior rear-view mirror or occupant-detection devices located in the roof liner.

Further details and advantages of the invention are described below with the aid of preferred exemplary embodiments in conjunction with the attached drawing.

BRIEF DESCRIPTION OF THE DRAWING

FIG. 1 is a schematic of a mono image-generation device according to the invention;

FIG. 2 is a schematic of a 3D image-generation device according to the invention;

FIG. 3 is a schematic of the 3D image-generation device shown in FIG. 2 having an angled base plate and not having any housing parts; and FIG. 4 is a schematic of the 3D image-generation device shown in FIG. 3 having an illumination module of greater area than that shown in FIG. 3.

DESCRIPTION OF THE PREFERRED EMBODIMENTS

FIG. 1 is a schematic of a mono image-generation device, in particular a mono camera, 1 according to the invention. Located according to the invention on a first, in particular rigid, printed board 10 are all the highly complex components of the camera 1, in particular, therefore, a microcontroller 11 as well as various memory elements 12, or suchlike. Located to the left of the memory elements 12 is an optical image-recording sensor 50, for example what is termed a CMOS image-recording sensor. Although other sensor types such as, for instance, CCD (CCD: Charge Coupled Device) sensors can in principle be considered, using a CMOS sensor offers a number of advantages. A CMOS sensor as a rule consumes less power than, for example, a CCD sensor. As no charges have to be transported via light-sensitive sensor surfaces in the case of a CMOS sensor, there is no occurrence of what is termed the smear effect, regarded as extremely disadvantageous. Random pixel accessing is as a rule furthermore possible in the case of CMOS sensors; with CCD sensors, by contrast, only individual rows can customarily be read out. An optics means 51 is located above the image-recording sensor 50. Said image-recording sensor 50 and optics means 51 lie on a common optical axis 52 oriented, for example, toward the interior of a motor vehicle (not shown in the drawings). The optics means 51 is retained by a housing 53. Said housing 53 is secured, preferably by adhesive means, to the first printed board 10. The optics means 51 and the housing 53 are inserted, preferably pre-assembled into an optics module, on the printed board 10. Located, according to the invention, adjacent to the first printed board 10 is a second printed board 20 on which are located all components other than the highly complex semiconductors (dies), in particular, therefore, capacitors, transistors, resistors, coils 21, or SMD plug-in connectors 22, with the latter facilitating a cable connection 90 to external evaluation units, or suchlike.

The first printed board 10 has preferably been manufactured or, as the case may be, equipped using what is termed chip-on-board technology and has, for example, up to six or eight layers. Thermal pads, vias, or what are termed Peltier elements 13 applied to the printed board 10 help to conduct heat into the base plate 40. Particular attention must be paid in selecting the substrate material for the printed board 10 to differences in the coefficient of thermal expansion between the chips 11, 12, etc. and the substrate. Various types of ceramic are, in particular, used, but also FR4 for chip-on-board. In order to further optimize heat removal, the contact points of the components (dies) and printed board can be at least partially embodied having additional via holes.

The second printed board 20 consists preferably of what is termed an FR4 substrate and can, like the first printed board 10, also have thermal pads, vias, or what are termed Peltier elements (not shown). Said second printed board 20 can, however, also be what is termed a metal circuit board. It has, for example, between two and four layers, thus significantly fewer than the first printed board 10. The printed boards 10 and 20 are each located on and secured to by, in particular, adhesive means a base plate 40. Apart from improved heat removal, the preferably metallic base plate 40 containing, in particular, aluminum and/or copper, particularly ensures additionally good rigidity and evenness for the printed boards 10 and 20 and hence also correct alignment of the optical axes 52. Like the components 11, 12, etc., the two printed boards 10 and 20 are also electrically interconnected preferably by means of what are termed bond wires 70. Components 11, 12, etc. and/or the bond wires 70 are preferably protected from external influences by means of an electrically insulating sealing compound 80. The units located on the base plate 40 can be simply and easily accommodated in a suitable housing 41. Located centrally above the optical axis 52 the housing cover 42 has an aperture in which, in a simplest embodiment, an optically permeable disk 43 made of, for instance, glass is located. The disk 43 is preferably harmonized with the motor vehicle's design, for example appropriately colored. It is also possible in the above-explained context to provide an optical filter 44 for the image-generation device 1 according to the invention. The disk 43 preferably itself has filter properties. Housing 41, housing cover 42, and disk 43 or, as the case may be, filter 44 are preferably embodied as being of one piece or, as the case may be, are pre-assembled into a single housing unit.

FIG. 2 shows a 3D image-generation device, in particular a 3D camera, 1 according to the invention. In contrast to the mono camera 1 shown in FIG. 1, the 3D camera 1 has two, preferably pre-assembled optics modules 50, 51, 52, 53 which, if preferred, are pre-adjusted units. Located between the optics modules is a further, third printed board 30 embodied from, for example, an FR4 substrate or preferably as a metal circuit board. Said board supports an illuminating unit 31, for example light-emitting diodes or, as the case may be, luminescent diodes, what are termed LED elements, arranged in the form of a matrix. The third printed board 30 is secured into position above the first printed board 10 via corresponding retention means 32. The optics housings 53 can also assume this function in place of said retention means 32. A thermal shield 60, for example a thermal-radiation deflecting foil, is located between the first printed board 10 and the third printed board 30 for the purpose of thermally insulating the first printed board 10 from the LED field 31. Above the optics means 51 the housing cover 42 has an optically permeable disk 43 or a suitable optical filter 44.

FIG. 3 shows the 3D image-generation device or, as the case may be, 3D camera 1 according to FIG. 2 having an angled base plate 40 and not having a housing or sealing compound. The angle of inclination α between the first printed board 10 and second printed board 20 or, as the case may be, of the base plate 40 can finally be any angle. The inclination α does not of course have to lie, as drawn, within one plane but can also extend into a 3-dimensional space. It is, though, clearly discernible how the housing of the camera 1 can, owing to the inclination α, be advantageously accommodated to the shape of a curved surface.

FIG. 4 shows the 3D image-generation device 1 according to FIG. 3. Compared to the exemplary embodiment shown in FIG. 3, FIG. 4 shows an illumination module 31 having a greater area and extending not only between but also to the side of the optics means 51. In order not to interfere with said optics means 51, the printed board 30 has a recess 33 in the area of the optics means 51.

The drawing shows clearly how the image-generation device 1 according to the invention has a minimal overall height at least in the area of its optics modules (50, 51, 52, 53), which is why the image-generation device 1 according to the invention is particularly suitable for use as a component built into the roof liner and serving as an occupant-detection unit, as a lane-change assistant built into the exterior rearview mirror, and for suchlike applications or, as the case may be, installation locations in a motor vehicle precisely where extreme installation conditions are encountered and known camera systems are inadequate.

I claim:

1. An image-generation device, comprising:
a first printed circuit board for highly complex semiconductors having at least one optical image-recording sensor; and
a second printed circuit board for remaining, less complex components;
a metallic base plate having mounted thereon at least one of said first printed circuit board and said second printed circuit board.

2. The image-generation device according to claim 1, which comprises an amount of adhesive attaching said at least one printed circuit board to said metallic base plate.

3. The image-generation device according to claim 1, wherein said highly complex semiconductors include devices selected from the group consisting of microcontrollers and memories, and said less complex components include devices selected from the group consisting of capacitors, transistors, resistors, coils, and plug-in connectors.

4. The image-generation device according to claim 1, configured for installation in a roof area of a motor vehicle for object detection exterior to and/or interior of the vehicle.

5. The image-generation device according to claim 1, configured for installation in an exterior rearview mirror of a motor vehicle for detecting an object or for detecting another vehicle on the adjacent lane.

6. The image-generation device according to claim 1, wherein said first printed circuit board has thermal pads, vias, or Peltier elements.

7. The image-generation device according to claim 6, wherein said second printed circuit board has thermal pads, vias, or Peltier elements.

8. The image-generation device according to claim 1, which comprises optics means rigidly located centrally above said optical image-recording sensor.

9. The image-generation device according to claim 1, wherein said optics means are pre-assembled together with a housing or a retention means.

10. The image-generation device according to claim 1, wherein said first printed circuit board is a board assembled with at least one of chip-on-board and flip-chip technology.

11. An image-generation device, comprising:
a first printed circuit board for highly complex semiconductors having at least one optical image-recording sensor, said first printed circuit board being a board assembled with at least one of chip-on-board and flip-chip technology and having a plurality of layers for connections and defined impedances;
a second printed circuit board for remaining, less complex components; and
a metallic base plate having mounted thereon at least one of said first printed circuit board and said second printed circuit board.

12. An image-generation device, comprising:
a first printed circuit board for highly complex semiconductors having at least one optical image-recording sensor;
a second printed circuit board for remaining, less complex components; and
a metallic base plate having mounted thereon at least one of said first printed circuit board and said second printed circuit board;
wherein said first printed circuit board and said second printed circuit board are located inclined at any angle with respect to one another.

13. An image-generation device, comprising:
a first printed circuit board for highly complex semiconductors having at least one optical image-recording sensor;
a second printed circuit board for remaining, less complex components;
a third printed circuit board having an illuminating unit; and
a metallic base plate having mounted thereon at least one of said first printed circuit board, said second printed circuit board, and said third printed circuit board.

14. The image-generation device according to claim 13, which further comprises optics means rigidly located above said optical image-recording sensor, and with said third printed circuit board disposed between and/or to the side of said optics means.

15. The image-generation device according to claim 14, wherein said third printed circuit board is retained by at least one of a housing of said optics means and a separate retention device, with the optics housing and/or the retention device establishing an electrical connection between said illuminating unit and said first printed circuit board.

16. The image-generation device according to claim 15, wherein said housing of said optics means and/or said retention device has a surface formed with a metal plating defining the electrical connection.

17. The image-generation device according to claim 13, which comprises a thermal insulating medium disposed between said first printed circuit board and said third printed circuit board.

18. The image-generation device according to claim 17, wherein said thermal insulating medium is a thermal shield.

19. The image-generation device according to claim 13, wherein at least one of said second printed circuit board and said third printed circuit board is an FR4 circuit board or a metal circuit board.

20. The image-generation device according to claim 13, which comprises a plurality of bond wires connecting chip terminals to a respective one of said printed circuit boards and a plurality of bond wires respectively interconnecting said first printed circuit board, said second printed circuit board, and said third printed circuit board.

21. The image-generation device according to claim 20, which comprises an amount of sealing compound disposed to protect said bond wires and/or components adjacent thereto from external influences.

22. An image-generation device, comprising:
a first printed circuit board for highly complex semiconductors having at least one optical image-recording sensor;
a second printed circuit board for remaining, less complex components having a height, away from said second circuit board, greater than a height of said highly complex semiconductors away from said first printed circuit board; and
a common metallic base plate having mounted thereon said first printed circuit board and said second printed circuit board.

* * * * *